United States Patent
Viehmann

(10) Patent No.: US 6,888,744 B2
(45) Date of Patent: May 3, 2005

(54) SELECTION DEVICE FOR A SEMICONDUCTOR MEMORY DEVICE

(75) Inventor: Hans-Heinrich Viehmann, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/623,824

(22) Filed: Jul. 21, 2003

(65) Prior Publication Data

US 2004/0141388 A1 Jul. 22, 2004

Related U.S. Application Data

(63) Continuation of application No. PCT/DE02/00141, filed on Jan. 18, 2002.

(51) Int. Cl.[7] .............................................. G11C 11/00
(52) U.S. Cl. ...................... 365/158; 365/205; 365/207
(58) Field of Search .................................. 365/158, 205, 365/207

(56) References Cited

U.S. PATENT DOCUMENTS

| | | | |
|---|---|---|---|
| 4,371,956 A | | 2/1983 | Maeda et al. |
| 5,297,093 A | * | 3/1994 | Coffman ..................... 365/208 |
| 5,493,246 A | | 2/1996 | Anderson |
| 6,359,829 B1 | | 3/2002 | Van Den Berg |
| 2001/0007537 A1 | | 7/2001 | Agawa et al. |
| 2002/0080644 A1 | * | 6/2002 | Ito ............................... 365/158 |

FOREIGN PATENT DOCUMENTS

EP     1 003 176 A2     5/2000

* cited by examiner

*Primary Examiner*—Huan Hoang
(74) *Attorney, Agent, or Firm*—Laurence A. Greenberg; Werner H. Stemer; Gregory L. Mayback

(57) ABSTRACT

A selection device for a semiconductor memory device for preventing voltage drops caused by read currents in a column multiplexer of a semiconductor memory device includes switch devices having two switch elements. Associated bit lines can be interlinked with a potential sampling connection or a current feed connection of a respective associated sense amplifier by the first and the second switch element.

19 Claims, 2 Drawing Sheets

SELECTION DEVICE FOR A SEMICONDUCTOR MEMORY DEVICE

CROSS-REFERENCE TO RELATED APPLICATION

This application is a continuation of copending International Application No. PCT/DE02/00141, filed Jan. 18, 2002, which designated the United States and was not published in English.

BACKGROUND OF THE INVENTION

Field of the Invention

The invention relates to a selection device for a semiconductor memory device or the like having, for each selectable access line device, particularly, for each bit line device, for accessing storage elements in the memory area of the semiconductor memory device that are connected to the respective selectable access line device, a respective associated switching device. The switching device can controllably connect the respective associated access line device, upon selection, to a sense-amplifier device, specifically, to a potential-sensing connection on the sense-amplifier device for detecting the electrical potential on the respective access line device and to a current-supply connection on the sense-amplifier device for supplying a compensating current to the respective access line device.

Modern semiconductor memory devices have a memory area containing a plurality of storage elements or memory cells. The storage elements or memory cells are, in this case, often produced in a matrix-like configuration and can be addressed using access line devices, for example, bit lines and word lines, in order to read and/or alter the storage state or information state of each storage element or each memory cell.

In this context, addressing and, hence, access are normally effected using appropriate selection devices based upon a row selection, for example, for the word lines, and by a column selection, for example, for the bit lines. In this case, the system of memory cells disposed in matrix form and of selected and unselected access lines forms a network of non-reactive resistances, with the cell resistances of the individual storage elements or memory cells needing to be taken into account in particular.

By selecting a corresponding word line and a corresponding bit line, the intention, particularly, for reading, is to address precisely one well-defined memory cell or one well-defined storage element. On account of the network-like interconnection of the plurality of memory cells or storage elements in the memory area, however, not only the signal representing the storage state of the addressed cell but also "parasitic signals" from the unselected storage elements or memory cells and/or the corresponding access lines arise. These parasitic signals are superimposed on the actual signal to be detected and analyzed from the selected cell and can result in corruptions.

To suppress these parasitic signals or to reduce their influence, use is normally made of a sense-amplifier device that can keep the potential difference across the unselected memory area and the related electric current as small as possible, but at least constant, so that the signal to be detected from the selected cell, particularly, in the case of MRAM cells based on a "cross-point configuration," can be distinguished from the parasitic signals.

The problem with conventional selection devices is that, under real conditions for the read operation, particularly, in MRAM cells, the reading current through the plurality of disconnected switching elements, particularly, in the form of transistor devices or the like, results in voltage drops, which means that the voltage or the potential on the access line device or bit line to be read cannot be regulated to the correct value by the sense-amplifier device.

SUMMARY OF THE INVENTION

It is accordingly an object of the invention to provide a selection device for a semiconductor memory device that overcomes the hereinafore-mentioned disadvantages of the heretofore-known devices of this general type and in which operating faults as a result of the voltage drops caused by reading currents can be avoided particularly easily and, nonetheless, reliably.

With the foregoing and other objects in view, in a semiconductor memory device having a memory area with storage elements, selectable access line devices respectively connected to the storage elements, and a sense-amplifier device with a potential-sensing connection and a current-supply connection, there is provided, in accordance with the invention, a selection device including switching devices each associated with and connected to a respective one of the access line devices for accessing the storage elements in the memory area, each of the switching devices controllably connecting, upon selection, the respective associated access line device to the potential-sensing connection for detecting an electrical potential on the respective access line device and to the current-supply connection for supplying a compensating current to the respective access line device and having first and second switching elements and, during operation, the first switching element connecting the associated access line device to the potential-sensing connection and the second switching element connecting the associated access line device to the current-supply connection.

With the objects of the invention in view, there is also provided a semiconductor memory device, including a memory area having storage elements, selectable access line devices respectively connected to the storage elements, a sense-amplifier device having a potential-sensing connection and a current-supply connection, the sense-amplifier device connected to the access line devices, and a selection device having switching devices each associated with and connected to a respective one of the access line devices for accessing the storage elements in the memory area, each of the switching devices controllably connecting, upon selection, the respective associated access line device to the potential-sensing connection for detecting an electrical potential on the respective access line device and to the current-supply connection for supplying a compensating current to the respective access line device and having first and second switching elements and, during operation, the first switching element connecting the associated access line device to the potential-sensing connection and the second switching element connecting the associated access line device to the current-supply connection.

Preferably, the access line devices are bit line devices and the switching devices are each associated with and connected to a respective one of the bit line devices.

The generic-type selection device for a semiconductor memory device or the like has, for each selectable access line device, particularly, for each bit line device or the like, for accessing storage elements in the memory area of the semiconductor memory device that are connected to the respective selectable access line device, a respective associated switching device or the like. In such a case, during operation, the switching device can controllably connect the respective access line device, upon selection, to a sense-amplifier device, specifically, to a potential-sensing connection on the sense-amplifier device for detecting the electrical potential on the respective access line device and to a current-supply connection on the sense-amplifier device for supplying a compensating current to the respective access line device.

In the case of the inventive selection device, each switching device has a first and a second switching element, respectively. During operation, the first switching element can connect the associated access line device to the potential-sensing connection on the sense-amplifier device. In addition, during operation, the second switching element can connect the associated access line device to the current-supply connection on the sense-amplifier device.

In the case of conventional selection devices, each selectable access line device, particularly, a bit line or the like, is substantially provided with a single switching element. This single switching element conventionally connects the respective associated access line device as a whole to the potential-sensing connection and, at the same time, to the current-supply connection on the associated sense-amplifier device. In the case of the conventional configuration, during operation in the real instance of application, a certain reading current, which results in an uncontrollable voltage drop across the entire selection device that cannot be corrected overall by the sense-amplifier device, also flows through the disconnected switching elements, e.g., through switching transistors. Consequently, in the case of conventional selection devices, the connected sense-amplifier devices cannot maintain any defined voltage at the end of the respective selected bit line devices.

With the inventive procedure, on the other hand, two switching elements are provided, the first switching element being able to set up a respective connection to the potential-sensing connection, and the second switching element being able to set up, in parallel therewith, a connection to the current-supply connection on the sense-amplifier device. If the access line device is selected, i.e., the bit line is selected, the first switching element is connected, and contact with the potential-sensing connection on the sense-amplifier device is set up. Because potential-sensing connections are of relatively high-impedance design, substantially no reading current flows through the closed first switching element, which means that the magnitude of the resistance of the first switching element and, hence, the voltage drop across it are insignificant. The potential-sensing connection can, thus, exactly detect the electrical potential that is present at the end of the access line device, particularly, the bit line device.

As a result of the second switching element provided in parallel therewith, which is, likewise, connected or closed upon selection, the connected sense-amplifier device uses the appropriate connection to readjust the compensating current until the potential difference detected through the first, closed switching element assumes the correct value. The resistance of the second switching element is, thus, likewise of virtually no significance, because its influence can just be corrected through the sense-amplifier device. The compensating current impressed by the sense-amplifier device is evaluated and reflects the respective programming state read from the selected memory cell or from the selected storage element.

The fundamental idea of the present invention is, thus, to produce, in the selection device, two switching elements connected in parallel with one another for making contact with the potential-sensing connection, on one hand, and with the current-supply connection, on the other hand, so that the voltage drops across the non-reactive resistances of the switching elements can be corrected based upon the regulating mechanism and have no significance at all.

To such an end, in accordance with another feature of the invention, the first and second switching elements provided are, respectively, in a form connected substantially in parallel with one another.

In addition, in accordance with a further feature of the invention, particularly simple operation of the inventive selection device results if the switching elements can each produce substantially two switching states, particularly, a connected or contact-making switching state and a disconnected or isolating switching state, respectively.

Particularly reliable regulation or particularly little influence for the non-reactive resistances of the switching elements is obtained if, in the first, connected or contact-making state, the first switching element can make comparatively low-resistance contact, particularly, with the potential connection on the sense-amplifier device, the lower resistance being compared to a contact of the second switching element.

In accordance with an added feature of the invention, the inventive selection device has a particularly simple form if the switching elements are in the form of transistor devices, particularly in the form of MOSFETs, or the like.

In this context, in accordance with an additional feature of the invention, provision is, preferably, made for respective drain regions of the transistor devices to be in a form connected to the associated access line device. In addition, provision is made for respective source regions of the transistor devices to be in a form connected to the respective potential-sensing connection or to the current-supply connection on the associated sense-amplifier device.

In principle, each access line device, particularly, each bit line device, can be associated with a respective separate sense amplifier device so that each switching device also selects a corresponding sense-amplifier device upon selection of the corresponding associated access line devices.

On the other hand, a particularly space-saving configuration is obtained if, in accordance with a concomitant feature of the invention, the plurality of output connections, particularly, of source regions, on the first and second switching elements are, respectively, connected to a common line device and, through the latter, to a common sense-amplifier device.

All in all, this means that a single, common sense-amplifier device can read a plurality of selectable access line devices. The common line devices, then, firstly connect the output connections of the first switching elements jointly to the single potential-sensing connection on the common sense-amplifier device. Secondly, the second common line device connects all the output connections of the second switching elements to the common current-supply connection on the common sense amplifier. This means that, all in all, the thus organized group of memory cells or selectable access line devices requires a total of just one single sense-amplifier device.

Other features that are considered as characteristic for the invention are set forth in the appended claims.

Although the invention is illustrated and described herein as embodied in a selection device for a semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
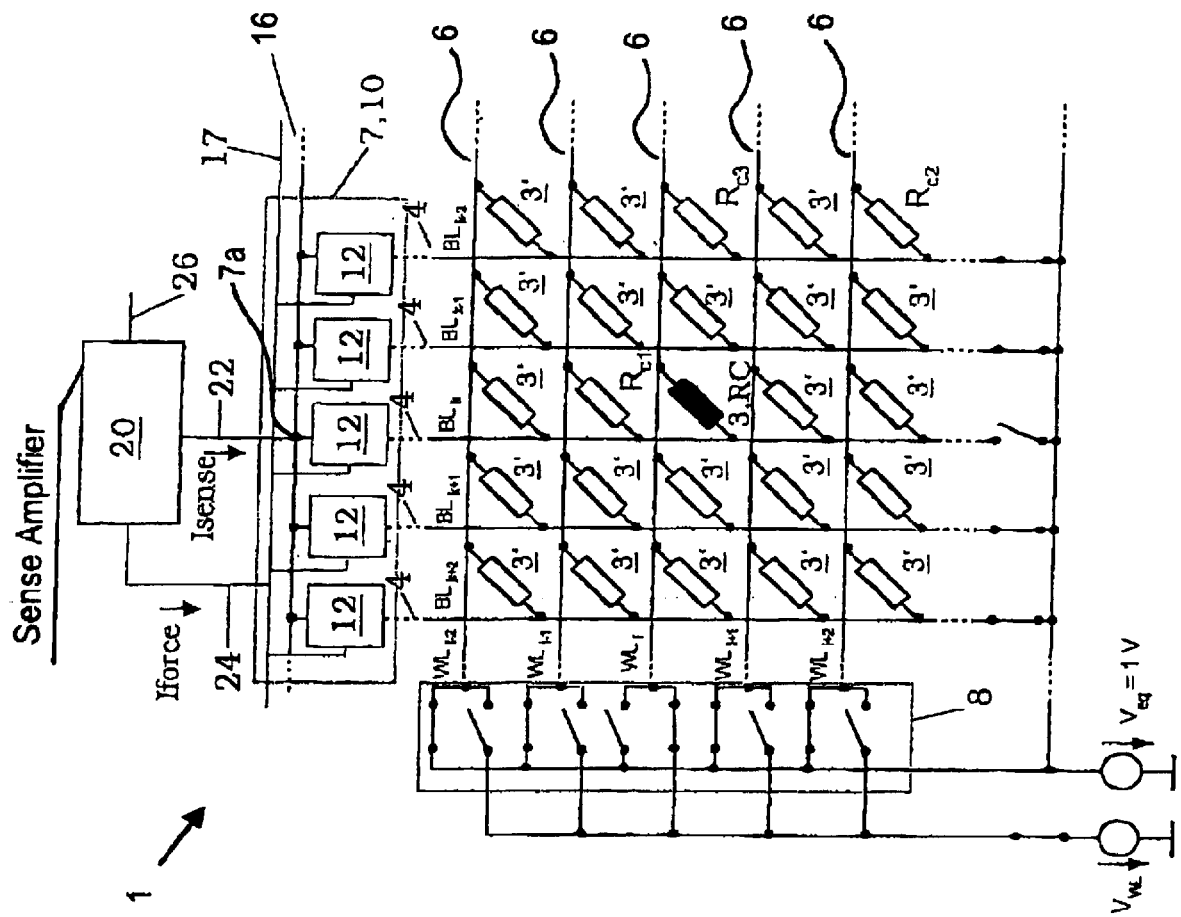
FIG. 1 is a schematic and block circuit diagram of a basic configuration of a memory device with the selection device according to the invention.

Referring now to the figures of the drawings in detail and first, particularly to FIG. 1 thereof, there is shown a schematic circuit configuration for the basic configuration of a semiconductor memory device 1 using an embodiment of the inventive selection device 10.

The semiconductor memory device 1 has a memory area 2. This includes a matrix-like configuration of memory cells 3 and 3', the memory cells or storage elements 3' not being selected for reading in the state of the semiconductor memory device 1 that is shown in FIG. 1. By contrast, the storage element 3 in the memory area 2 has been selected for reading. For such selection, the word line WLi together with the bit line BLk of the access line devices 6 and 4 are realized by corresponding switching states of the row selectors or multiplexers 8 and column selectors or multiplexers 7 in FIG. 1. Both the row selectors and the column selectors 8 and 7 can be of the configuration described in line with the invention.

The selected word line WLi is at the word line voltage or reading voltage Vw1. All of the unselected word lines or bit lines of the access line devices 6 and 4 are at the equipotential voltage or equalization voltage Veq. Ideally, the equipotential voltage Veq is also present on the selected bit line BLk at its end, namely, at the node 7a and, thus, through line 16, at the potential-sensing connection 22 on the sense-amplifier configuration 20.

FIG. 1 particularly shows the interconnection for reading a cross-point MRAM memory matrix. The configuration in FIG. 1 also shows that the non-reactive resistances RC1 and RC2 in the corresponding memory cells 3' conduct no parasitic currents that can disturb the reading signal for the selected memory cell 3 with its non-reactive resistance RC. The currents through RC3 also do not result in any fundamental disturbance of the reading signal.

FIG. 1 also shows that the column multiplexer 7 shown or the selection device 10 for the bit lines BLj can, respectively, connect a particular bit line BLk in the memory device 1 to the input 22 of the sense-amplifier device 20.

In conventional configurations, it is not possible to connect an appropriate number of switching elements or switch transistors, namely, corresponding to the number of selectable access line devices or bit lines, for the column multiplexer simply between the bit lines of the MRAM array and the input of the sense amplifier 20. This is because the reading current would, then, need to flow through the respective switch transistors and would result in an uncontrollable voltage drop that would not be able to be corrected by the sense amplifier 20. Hence, in conventional configurations, no defined voltage would become established at the end of the selected bit line BLk or would be able to be kept by the amplifiers 20.

Figure 2:
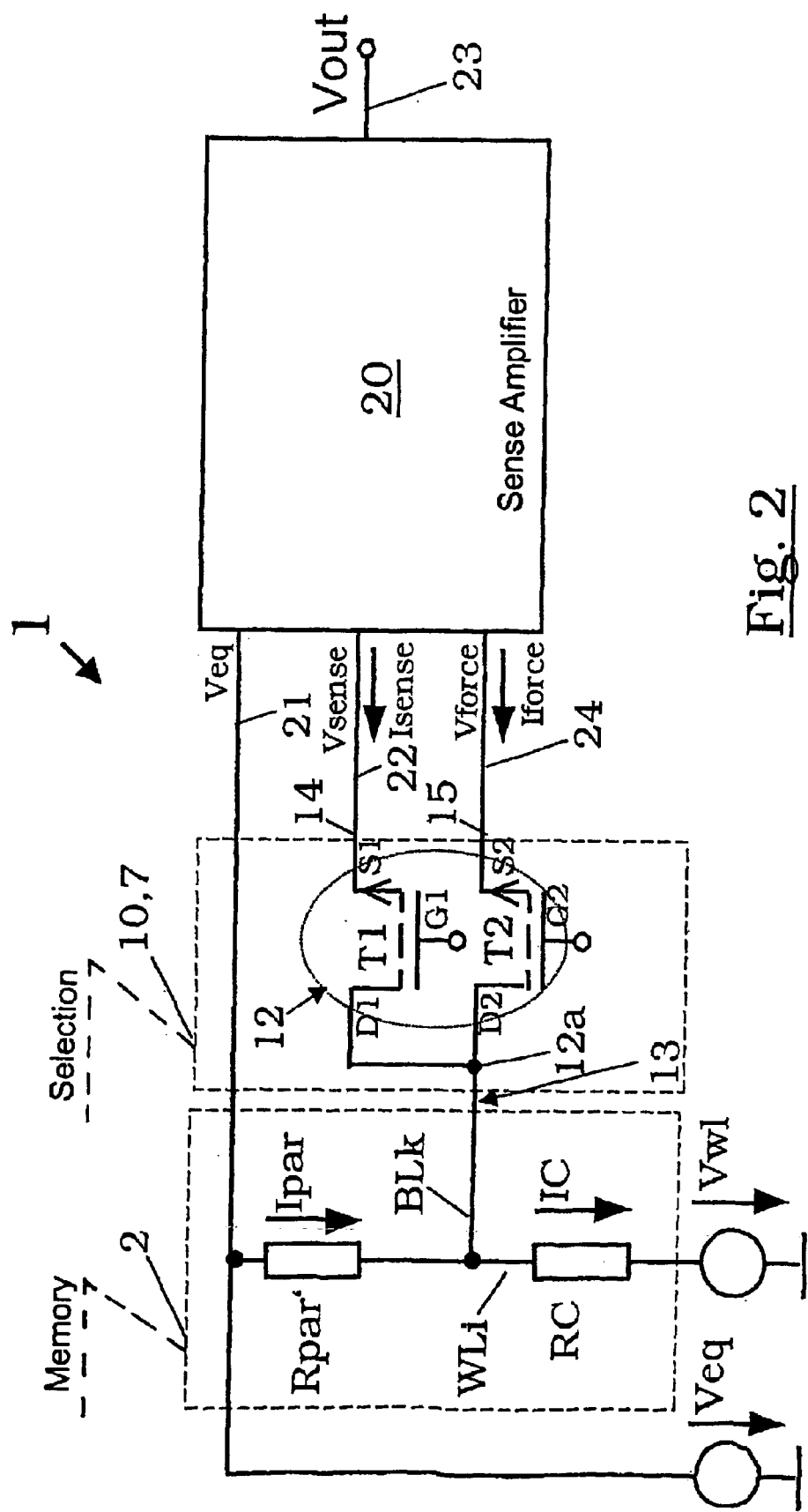
FIG. 2 is a schematic and block circuit diagram of details of a connection of the selection device of FIG. 1.

FIG. 2 uses a schematic circuit diagram to show an embodiment of the inventive selection device 10 when used in a semiconductor memory device 1.

The memory area 2 of the semiconductor memory device 1 has a memory cell 3 selected for reading and also unselected memory cells 3'. The non-reactive resistances existing in connection with these selected and unselected memory cells 3 and 3' are denoted by RC and Rpar'. The electrical currents flowing through the selected and unselected memory cells 3 and 3' are referred to as cell current Ic and parallel current Ipar.

In this case, the connected selection device 10 is in the form of a column selection device 7. In FIG. 2, only the switching device 12 for selecting the kth bit line BLk is shown. The corresponding switching elements T1, T2 are in the form of MOSFETs and have drain regions D1, D2, source regions S1, S2, and gate regions G1 and G2.

The first and second switching elements T1 and T2 are connected in parallel with one another from the node 12a. The drain regions D1 and D2 are connected directly to the kth bit line BLk in the configuration. The source regions S1 and S2 of the switching elements T1 and T2 are connected to the potential-sensing connection 22 and to the current-supply connection 24, respectively, on the sense-amplifier device 20. The connection 21 is used to supply the equalization voltage or equipotential voltage Veq. The output 23 of the sense-amplifier device 20 is used to provide the evaluated reading signal Vout, which represents the information or storage state of the selected memory cell 3.

The bit line BLk to be read in the memory area 2 itself is shown here in the form of a series circuit including the corresponding resistances Rpar' and Rc. In comparison with FIG. 1, RC is shown to be the non-reactive resistance of the selected memory cell 3. This resistance is connected to ground through the word line voltage or reading voltage Vwl by the selected bit line BLk.

FIG. 2 shows that the selected bit line BLk is connected to the sense-amplifier device 20 through the switching transistors T1 and T2 as first and second switching elements. In more complex memory configurations, it may be necessary for the switching transistors T1 and T2 each to be formed also by a more complex series circuit including a plurality of transistor devices. The number of transistors that needs to be used as a series circuit for T1 and T2 is of substantially no significance for the manner of operation of the inventive principle presented here, however.

In line with the invention, the switching elements T1 and T2, particularly, the corresponding transistor devices T1 and T2, have the following effect: the input, namely the potential-sensing connection 22, of the sense-amplifier device 20 is connected directly to the end of the selected bit line device BLk through the transistor device T1. The sense-amplifier device 20 can, thus, sample and ascertain the voltage Vsense that is present on the selected bit line BLk directly. The non-reactive resistance of the switching element or of the transistor device 1 has no significance on account of the relatively high input resistance of the potential-sensing resistance 22 of the sense-amplifier device 20 because no significant current flows through the switching element T1, i.e., Isense is substantially equal to zero.

Through the second switching element or the second transistor device T2, the sense-amplifier device 20 uses the current-supply connection 24 to readjust the voltage Vforce applied thereto, the supply current or the compensating current Icomp or Iforce until the correct voltage is detected on the selected bit line BLk through the first switching element or the first transistor device T1 and is set.

Consequently, the non-reactive resistance of the second switching element T2 is also irrelevant in this context because its influence is directed by the sense-amplifier device 20. The compensating current or supply current Icomp, Iforce is evaluated by the sense-amplifier device 20 and substantially represents the programming state or storage state read for the selected memory cell 3.

The inventive circuit illustrated, thus, makes it possible to provide a selection device 10, particularly a column multiplexer 7, in which voltage drops across the switching elements or switching transistors T1 and T2 that could be brought about by reading currents Isense flowing have no significance.

I claim:

1. In a semiconductor memory device having a memory area with storage elements, selectable access line devices respectively connected to the storage elements, and a sense-amplifier device with a potential-sensing connection and a current-supply connection, a selection device comprising:
   switching devices each associated with and connected to a respective one of the access line devices for accessing the storage elements in the memory area, each of said switching devices:
      controllably connecting, upon selection, the respective associated access line device to the potential-sensing connection for detecting an electrical potential on the respective access line device and to the current-supply connection for supplying a compensating current to the respective access line device; and
      having first and second switching elements and, during operation, said first switching element connecting the associated access line device to the potential-sensing connection and said second switching element connecting the associated access line device to the current-supply connection.

2. The selection device according to claim 1, wherein said first and second switching elements are respectively connected in parallel with one another.

3. The selection device according to claim 1, wherein said first and second switching elements each produce two switching states.

4. The selection device according to claim 3, wherein said two switching states include a connected switching state and a disconnected switching state.

5. The selection device according to claim 3, wherein said two switching states include a contact-making switching state and an isolating switching state.

6. The selection device according to claim 3, wherein, in a first of said two switching states, said first switching element makes a comparatively low-impedance contact.

7. The selection device according to claim 3, wherein, in a first of said two switching states, said first switching element makes a comparatively low-impedance contact to the potential-sensing connection on the sense-amplifier device.

8. The selection device according to claim 3, wherein, in a first of said two switching states, said first switching element makes a low-impedance contact as compared to a contact of said second switching element.

9. The selection device according to claim 3, wherein, in a first of said two switching states, said first switching element makes a low-impedance contact to the potential-sensing connection as compared to a contact of said second switching element.

10. The selection device according to claim 1, wherein said first and second switching elements are transistor devices.

11. The selection device according to claim 1, wherein said first and second switching elements are MOSFETs.

12. The selection device according to claim 10, wherein respective drain regions of said transistor devices are connected to the respectively connected one of the access line devices.

13. The selection device according to claim 12, wherein source regions of said transistor devices are each respectively connected to one of the respective potential connection and the respective current-supply connection on the associated sense-amplifier device.

14. The selection device according to claim 10, wherein a source region of said transistor devices are each respectively connected to one of the respective potential connection and the respective current-supply connection on the associated sense-amplifier device.

15. The selection device according to claim 10, wherein:
   the sense-amplifier device is a single common sense-amplifier device;
   said first and second switching elements have output connections; and
   a common line device respectively connects said output connections to said single sense-amplifier device.

16. The selection device according to claim 10, wherein:
   the sense-amplifier device is a single common sense-amplifier device;
   said first and second switching elements have source regions; and
   a common line device respectively connects said source regions to said single sense-amplifier device.

17. The selection device according to claim 1, wherein:
   the access line devices are bit line devices; and
   said switching devices are each associated with and connected to a respective one of the bit line devices.

18. In a semiconductor memory device having a memory area with storage elements, selectable access line devices including bit line devices respectively connected to the storage elements, and a sense-amplifier device with a potential-sensing connection and a current-supply connection, a selection device comprising:
   switching devices each associated with and connected to a respective one of the bit line devices for accessing the storage elements in the memory area, each of said switching devices:
      controllably connecting, upon selection, the respective associated bit line device to the potential-sensing connection for detecting an electrical potential on the respective bit line device and to the current-supply connection for supplying a compensating current to the respective bit line device; and
      having first and second switching elements and, during operation, said first switching element connecting the associated bit line device to the potential-sensing connection and said second switching element connecting the associated bit line device to the current-supply connection.

19. A semiconductor memory device, comprising:
   a memory area having storage elements;
   selectable access line devices respectively connected to said storage elements;

a sense-amplifier device having a potential-sensing connection and a current-supply connection, said sense-amplifier device connected to said access line devices; and a selection device having switching devices each associated with and connected to a respective one of said access line devices for accessing the storage elements in the memory area, each of said switching devices:
controllably connecting, upon selection, the respective associated access line device to the potential-sensing connection for detecting an electrical potential on the respective access line device and to the current-supply connection for supplying a compensating current to the respective access line device; and having first and second switching elements and, during operation, said first switching element connecting the associated access line device to the potential-sensing connection and said second switching element connecting the associated access line device to the current-supply connection.

* * * * *

UNITED STATES PATENT AND TRADEMARK OFFICE
CERTIFICATE OF CORRECTION

| | | |
|---|---|---|
| PATENT NO. | : 6,888,744 B2 | Page 1 of 1 |
| APPLICATION NO. | : 10/623824 | |
| DATED | : May 3, 2005 | |
| INVENTOR(S) | : Hans-Heinrich Viehmann | |

It is certified that error appears in the above-identified patent and that said Letters Patent is hereby corrected as shown below:

On the title page Item [30] should read as follows:

Jan 19, 2001        (DE)        .......... 101 02 431

Signed and Sealed this

Twenty-second Day of May, 2007

JON W. DUDAS
*Director of the United States Patent and Trademark Office*